United States Patent
Jung

(10) Patent No.: US 7,602,208 B2
(45) Date of Patent: Oct. 13, 2009

(54) ON DIE TERMINATION DEVICE THAT CAN CONTROL TERMINAL RESISTANCE

(75) Inventor: Jong Ho Jung, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/964,083

(22) Filed: Dec. 26, 2007

(65) Prior Publication Data
US 2009/0002091 A1 Jan. 1, 2009

(30) Foreign Application Priority Data
Jun. 29, 2007 (KR) .................. 10-2007-0065406

(51) Int. Cl.
*H03K 17/16* (2006.01)
(52) U.S. Cl. .................. 326/30; 326/16; 326/32
(58) Field of Classification Search .................. 326/30, 326/32–34, 87
See application file for complete search history.

(56) References Cited

U.S. PATENT DOCUMENTS

| 6,157,206 | A | 12/2000 | Taylor et al. | |
|---|---|---|---|---|
| 7,148,721 | B2* | 12/2006 | Park | 326/30 |
| 7,372,294 | B2* | 5/2008 | Kim | 326/30 |
| 2007/0103189 | A1* | 5/2007 | Chang et al. | 326/30 |
| 2007/0126467 | A1* | 6/2007 | Kim | 326/30 |

FOREIGN PATENT DOCUMENTS

| JP | 2005-39549 A | 2/2005 |
|---|---|---|
| KR | 2004-0095912 A | 11/2004 |
| KR | 2005-0001167 A | 1/2005 |
| KR | 1020050064897 | 6/2005 |

* cited by examiner

*Primary Examiner*—Ahn Q Tran
(74) *Attorney, Agent, or Firm*—Ladas & Parry LLP

(57) ABSTRACT

An on die termination controls a terminal resistance value in accordance with a test signal. The one die termination device comprises an on die termination control unit and an on die termination resistor unit and can change the terminal resistance value in accordance with the test signal, so that the terminal resistance can be easily analyzed. The one die termination control unit comprises a resistance control enable signal generating unit and a resistance control signal generating unit and generates at least one resistance increment signal and at least one resistance decrement signal. The on die termination resistor unit comprises a resistor and a plurality of switch units that are connected in parallel and is driven by a driving signal and uses the resistance increment signal and resistance decrement signal to control the on die termination resistance value.

24 Claims, 4 Drawing Sheets

ON DIE TERMINATION DEVICE THAT CAN CONTROL TERMINAL RESISTANCE

CROSS-REFERENCE TO RELATED APPLICATIONS

The present application claims priority to Korean patent application number 10-2007-0065406 filed on Jun. 29, 2007, which is incorporated herein by reference in its entirety.

BACKGROUND OF THE INVENTION

The present invention relates generally to a semiconductor device, and more particularly to an on die termination device that controls a terminal resistance value in accordance with a test signal.

A semiconductor device, such as a memory device, transmits/receives data to/from external systems. If an impedance of the semiconductor device is different from an impedance of the bus line, which is connected with the external system to transmit the data, the data could possibly be reflected.

Therefore, the semiconductor device includes an on die termination (hereinafter, ODT) device that matches the impedance of the systems interfaced with one another. The ODT prevents the transmittance signal from being reflected allowing the semiconductor device to support high-speed operations.

FIG. 1 is a drawing showing a general ODT device equipped in a Double Data Rate (DDR2) Dynamic Random Access Memory (DRAM). The ODT device of FIG. 1 includes an ODT control unit 1 and an ODT resistor unit 2.

The ODT control unit 1 receives an ODT enable signal EN having a value corresponding to the set state of an extended mode register set (EMRS; not shown), and the ODT control unit generates and outputs a pullup driving signal PU and a pulldown driving signal PD according to the ODT enable signal EN.

The ODT resistor unit 2 includes a pullup resistor unit 2a and a pulldown resistor unit 2b connected in series between terminals to which a power supply voltage VDDQ and a ground voltage VSS are applied. An output node ND1 is generated between the pullup resistor unit 2a and the pulldown resistor unit 2b.

The pullup resistor unit 2a includes a PMOS transistor P1 and a resistor R1 that are connected in series. The pulldown resistor unit 2b includes a NMOS transistor N1 and a resistor R2 that are connected in series.

The PMOS transistor P1 is driven by the pullup driving signal PU, and the NMOS transistor N1 is driven by the pulldown driving signal PD. If the PMOS transistor P1 and the NMOS transistor N1 are driven, the power supply voltage VDDQ is applied to the resistor R1 and the ground voltage VSS is applied to the resistor R2. Subsequently, the voltage controlled by the resistors R1, R2 is applied to the output node ND1, and the voltage applied to the voltage node ND1 is outputted as an output signal DQ.

It is preferable that the level of the output signal DQ be set to VDDQ/2. As such, the resistance values of the resistors R1, R2 are designed in consideration of the level of the output signal DQ. However, the actual resistance values of the resistors R1, R2 may differ from the designed value due to various factors, such as a change in production process, a change in power supply voltage, or a temperature change.

In addition, when analyzing the ODT resistance, it is necessary to control the resistance values of the pullup resistor unit 2a and the pulldown resistor unit 2b. However, if the pullup resistor unit 2a and the pulldown resistor unit 2b are designed as shown in FIG. 1, it is difficult to control the resistance values of the pullup resistor unit 2a and the pulldown resistor unit 2b. Therefore, it is difficult to efficiently analyze the ODT resistance.

After the semiconductor chip is produced, a partial portion of the metal layer having the resistor R1, R2 must be corrected by performing a focused ion beam (hereinafter, FIB) process. However, in this case, the contact resistance of a contact formed in the top portion of the metal layer can change the resistance values of the resistors R1, R2. As such, a problem exists in a typical ODT device, in that it is difficult to change the resistance value of the resistor R1, R2 while analyzing the ODT resistance.

SUMMARY OF THE INVENTION

The present invention provides an on die termination device that easily changes a terminal resistance value in accordance with a test signal.

The present invention provides an on die termination device that can easily change a terminal resistance value upon performing an ODT resistance analysis.

The die termination device according to the present invention comprises an on die termination control unit which generates at least one resistance increment signal from a resistance increment test signal and at least one resistance decrement signals from a resistance decrement test signal when in a test mode; and an on die termination resistor unit which is driven by at least one driving signal wherein a terminal resistance of the on die termination device can be varied by the resistance increment signal and the resistance decrement signal.

The on die termination control unit comprises a resistance control enable signal generating unit which generates a resistance increment enable signal from the resistance increment test signal (which is selectively activated), and the resistance decrement enable signal from the resistance decrement test signal (which is selectively activated); and a resistance control signal generating unit which generates at least one resistance increment signal according to the resistance increment enable signal and the driving signal and at least one resistance decrement signal according to the resistance decrement enable signal and the driving signal.

The test mode signal, the resistance increment test signal, and the resistance decrement test signal are applied from an extended mode register set.

The resistance control enable signal generating unit comprises a first NAND gate which NAND-combines the test mode signal with the resistance increment test signal; a first inverter which inverts an output signal of the first NAND gate and outputs the resistance increment enable signal; a second NAND gate which NAND-combines the test mode signal with the resistance decrement test signal; and a second inverter which inverts an output signal of the second NAND gate and outputs the resistance decrement enable signal.

The resistance control signal generating unit comprises a first output unit which inverts the driving signal to output at least one resistance increment signal when the resistance increment enable signal is activated; and a second output unit which outputs the driving signal as at least one resistance decrement signal when the resistance decrement enable signal is activated.

The first output unit comprises a first NOR gate which NOR-combines the resistance increment enable signal with the driving signal; and a third inverter which inverts an output signal of the first NOR gate and outputs the resistance increment signal.

The second output unit comprises a fourth inverter which inverts the driving signal; and a third NAND gate which NAND-combines the resistance decrement enable signal with an output signal of the fourth inverter and outputs the resistance decrement signal.

The on die termination resistor unit comprises switch units which are connected in parallel between a power supply terminal and a first node and controlled by the driving signal, the resistance increment signal and the resistance decrement signal to electrically connect the first node with the power supply terminal; and a resistor which is connected between the first node and an output node.

The switch units may be composed of PMOS transistors that are controlled by the driving signal, the resistance increment signal, and the resistance decrement signal which are applied to corresponding gates thereof to deliver the power supply voltage to the first node.

The switch unit may also be composed of NMOS transistors that are controlled by the driving signal, the resistance increment signal, and the resistance decrement signal which are applied to corresponding gates thereof to deliver the ground voltage to the first node.

Further, an on die termination device according to other embodiment of the present invention comprises a resistance control enable signal generating unit which selectively activates and outputs a resistance increment enable signal and a resistance decrement enable signal in accordance with a resistance increment test signal and a resistance decrement test signal; a resistance control signal generating unit which generates at least one or more pullup/pulldown resistance increment signals according to an activation of the resistance increment enable signal and outputs at least one or more pullup/pulldown resistance decrement signals according to an activation of the resistance decrement enable signal; and an on die termination resistor unit which is driven by pullup/pulldown driving signals, and which controls an on die termination resistance value according to the pullup/pulldown resistance increment signal and the pullup/pulldown resistance decrement signal.

The resistance control enable signal generating unit comprises a first NAND gate which NAND-combines a test mode signal with the resistance increment test signal; a first inverter which inverts an output signal of the first NAND gate and outputs the resistance increment enable signal; a second NAND gate which NAND combines a test mode signal with the resistance decrement test signal; and a second inverter which inverts an output signal of the second NAND gate and outputs the resistance decrement enable signal.

The test mode signal, the resistance increment test signal and the resistance decrement test signal are supplied from an extended mode register set.

The resistance control signal generating unit comprises a pullup resistance control signal generating unit which outputs the pullup driving signal as an pullup resistance increment signal and a pullup resistance decrement signal according to the resistance increment enable signal and the resistance decrement enable signal; and a pulldown resistance control signal generating unit which outputs the pulldown driving signal as an pulldown resistance increment signal and a pulldown resistance decrement signal according to the resistance increment enable signal and the resistance decrement enable signal.

The pullup resistance control signal generating unit comprises a first NOR gate which NOR-combines the pullup driving signal with the resistance increment enable signal; a third inverter which inverts an output signal of the first NOR gate and outputs the pullup resistance increment signal; a fourth inverter which inverts the pullup driving signal; and a third NAND gate which NAND-combines an output signal of the fourth inverter with the resistance decrement enable signal and outputs the pullup resistance decrement signal.

The pulldown resistance control signal generating unit comprises a fourth inverter which inverts the pulldown driving signal; a second NOR gate which NOR-combines an output signal of the fourth inverter with the resistance increment enable signal and outputs the pulldown resistance increment signal; a fourth NAND gate which NAND-combines the pulldown driving signal with the resistance decrement enable signal; and a fifth inverter which inverts an output signal of the fourth NAND gate and outputs the pulldown resistance decrement signal.

The die termination resistor unit comprises pullup switch units which are connected in parallel between a power supply voltage terminal and a first node to be driven by the pullup driving signal and is controlled by the pullup resistance increment signal and the pullup resistance decrement signal to electrically connect the power supply voltage terminal with the first node; a first resistor which is connected between the first node and an output node; pulldown switch units which are connected in parallel between a ground voltage terminal and a second node to be driven by the pulldown driving signal and is controlled by the pulldown resistance increment signal and the pulldown resistance decrement signal to connect the ground voltage terminal with the second node electrically; and a second resistor which is connected between the second node and the output node.

The pullup switch unit is composed of PMOS transistors which are controlled by the pullup driving signal, the pullup resistance increment signal, and the pullup resistance decrement signal which are applied to corresponding gates thereof to deliver the power supply voltage to the first node.

The pulldown switch unit is composed of NMOS transistors which are controlled by the pulldown driving signal, the pulldown resistance increment signal, and the pulldown resistance decrement signal which are applied to each gate thereof to deliver the ground voltage to the second node.

An on die termination device according to other embodiment of the present invention comprises a pullup resistor unit having a pullup resistance value increased or decreased according to a test signal; and a pulldown resistor unit which is connected with the pullup resistor unit through a common node and has a pulldown resistance value increased or decreased according to the test signal.

The test signal is output from an extended mode register, and the test signal is set with a resistance increment signal that is activated or a resistance decrement signal that is activated.

The pullup resistor unit and the pulldown resistor unit each comprise three or more switch elements which are connected in parallel, wherein switch elements are controlled by the resistance increment signal to increase the pullup/pulldown resistance value and switch elements are controlled by the resistance decrement signal to decrease the pullup/pulldown resistance value.

The pullup resistor unit and the pulldown resistor unit both comprise a resistor that is commonly connected with the common node and the three or more switch elements.

The switch elements of the pullup resistor unit are composed with PMOS transistors and the switch elements of the pulldown resistor unit are composed with NMOS transistors.

DESCRIPTION OF SPECIFIC EMBODIMENTS

Hereinafter, preferred embodiments of the present invention will be described in detail with reference to accompanying drawings.

The on die termination (ODT) device according to the present invention can be analyzed by controlling the terminal resistance value in accordance with a test signal, and after analyzing the ODT, the terminal resistance value can be utilized when making revisions to the metal layer.

Figure 2:
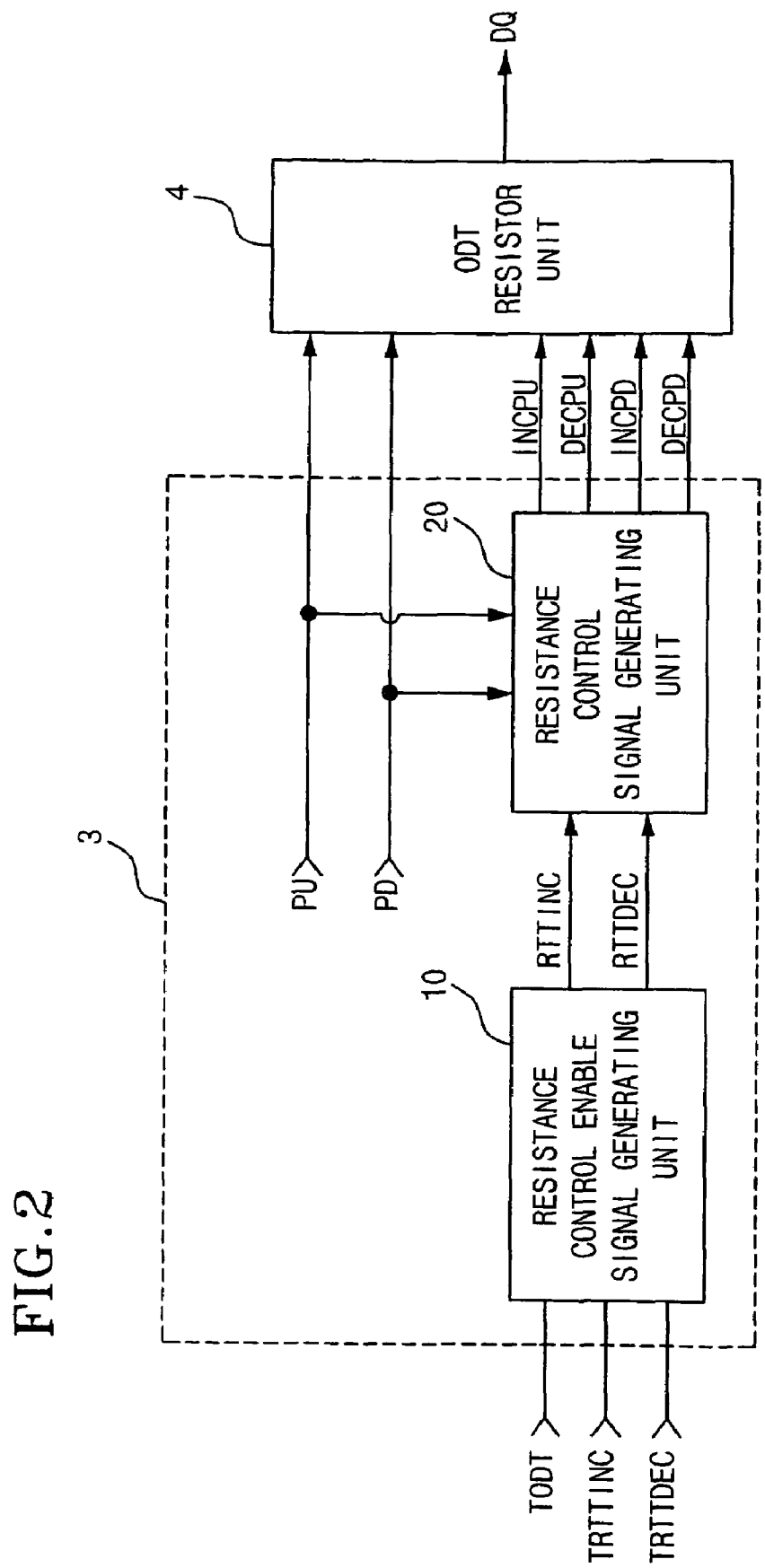
FIG. 2 is a structural diagram showing an on die termination device according to an embodiment of the present invention.

Referring to FIG. 2, the on die termination device according to the present invention includes an ODT control unit 3 and an ODT resistor unit 4.

More specifically, the ODT control unit 3 includes a resistance control enable signal generating unit 10 and a resistance control signal generating unit 20.

The resistance control enable signal generating unit's 10 inputs include a test mode signal TODT, a resistance increment test signal TRTTINC and a resistance decrement test signal TRTTDEC. The resistance control enable signal generating unit selectively activates a resistance increment enable signal RTTINC and a resistance decrement enable signal RTTDEC and then outputs the activated signals.

In addition, the resistance control signal generating unit 20 inverts a pullup driving signal PU and a pulldown driving signal PD using the resistance increment enable signal RTTINC, and the resistance control signal generating unit 20 outputs a pullup resistance increment signal INCPU and a pulldown resistance increment signal INCPD. Using the resistance decrement enable signal RTTDEC, the resistance control signal generating unit 20 outputs the pullup driving signal PU and the pulldown driving signal PD as a pullup resistance decrement signal DECPU and a pulldown resistance decrement signal DECPD.

Herein, the test mode signal TODT, the resistance increment test signal TRTTINC and the resistance decrement test signal TRTDEC can be supplied from the extended mode register set (EMRS). The test mode signal TODT is a signal that enables the test mode of the on die termination device. The resistance increment test signal TRTTINC and the resistance decrement test signal TRTTDEC are selectively activated.

Further, the pullup/pulldown driving signals PU, PD can be supplied from the EMRS and activated by an ODT enable signal (not shown) that is produced by decoding addresses. The pullup/pulldown driving signals PU, PD drive the ODT resistor unit 4.

Figure 3:
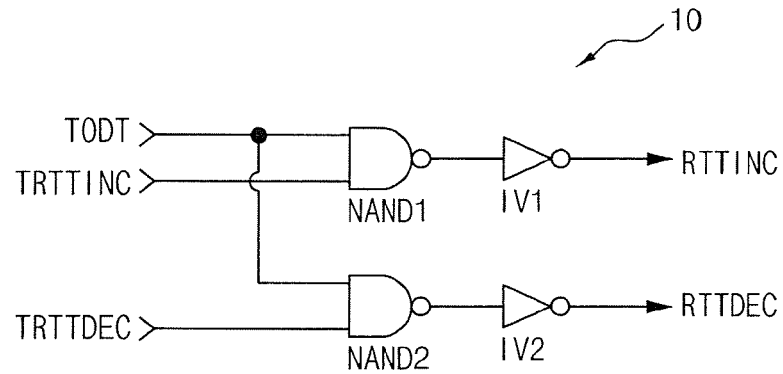
FIG. 3 is a detailed circuit diagram showing the resistance control enable signal generating unit of FIG. 2.

The resistance control enable signal generating unit 10 can include a plurality of NAND gates and a plurality of inverters. The resistance control enable signal generating unit 10 shown in FIG. 3 includes NAND gates NAND1, NAND2 and inverters IV1, IV2.

The NAND gate NAND1 NAND-combines the test mode signal TODT and the resistance increment test signal TRTTINC. The inverter IV1 inverts the output signal of the NAND gate NAND1 and outputs the resistance increment enable signal RTTINC.

The NAND gate NAND2 NAND-combines the test mode signal TODT and the resistance decrement test signal TRTTDEC. The inverter IV2 inverts the output signal of the NAND gate NAND2 and outputs the resistance decrement enable signal RTTDEC.

Figure 4:
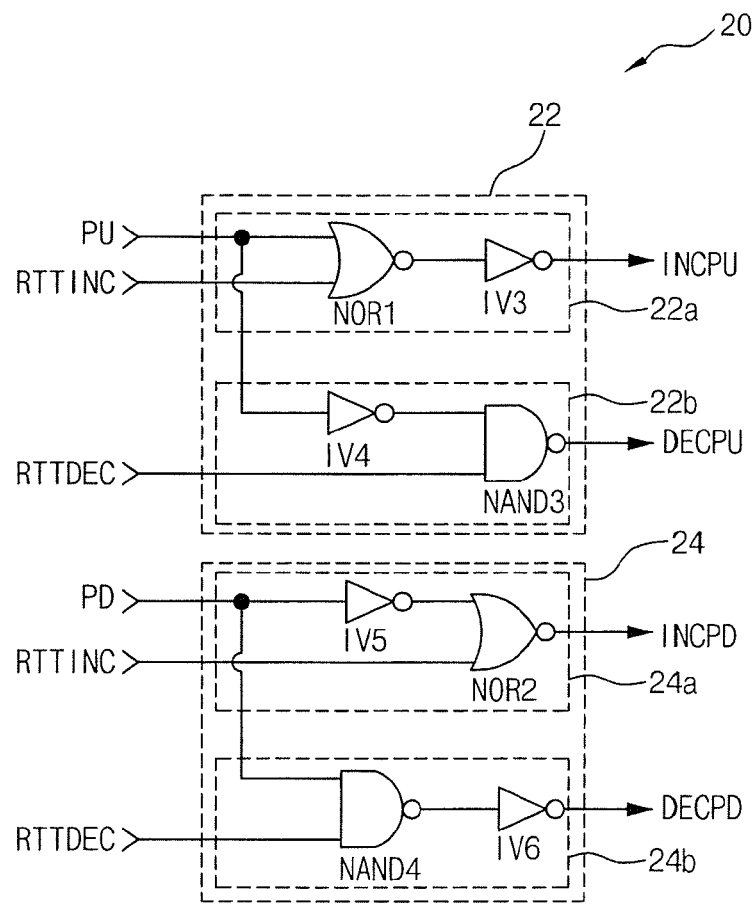
FIG. 4 is a detailed circuit diagram showing the resistance control signal generating unit of FIG. 2.

As shown in FIG. 4, the resistance control signal generating unit 20 can include a pullup resistance control signal generating unit 22 and a pulldown resistance control signal generating unit 24.

The pullup resistance control signal generating unit 22 includes a pullup resistance increment signal outputting unit 22a that inverts a pullup driving signal PU and outputs the pullup resistance increment signal INCPU according to the resistance increment enable signal RTTINC, and a pullup resistance decrement outputting unit 22b that outputs the pullup driving signal PU as the pullup resistance decrement signal DECPU according to the resistance decrement enable signal RTTDEC.

The pullup resistance increment signal outputting unit 22a includes a NOR gate NOR1 and an inverter IV3. The NOR gate NOR1 NOR-combines the pullup driving signal PU and the resistance increment enable signal RTTINC. The inverter IV3 inverts the output signal of the NOR gate NOR1 to output the pullup resistance increment signal INCPU.

The pullup resistance decrement signal outputting unit 22b includes a NAND gate NAND3 and an inverter IV4. The NAND gate NAND3 NAND-combines the pullup driving signal PU, which has been inverted by the inverter IV4, with the resistance decrement enable signal RTTDEC to output the pullup resistance decrement signal DECPU.

The pulldown resistance control signal generating unit 24 includes: a pulldown resistance increment outputting unit 24a, which inverts the pulldown driving signal PD according to the resistance increment enable signal RTTINC to output the pulldown resistance increment signal INCPD; and a pulldown resistance decrement outputting unit 24b that outputs the pulldown resistance driving signal PD as the pulldown resistance decrement signal DECPD according to the resistance decrement enable signal RTTDEC.

The pulldown resistance increment outputting unit 24a includes a NOR gate NOR2 and an inverter IV5. The NOR gate NOR2 NOR-combines the pulldown driving signal PD, having been inverted by the inverter IV5, with the resistance increment enable signal RTTINC to output the pulldown resistance increment signal INCPD.

The pulldown resistance decrement outputting unit 44b includes a NAND gate NAND4 and an inverter IV6. The NAND gate NAND4 NAND-combines a pulldown driving signal PD with a resistance decrement enable signal RTTDEC, and the inverter IV6 inverts the output signal of the NAND gate NAND4 to output the pulldown resistance decrement signal DECPD.

Figure 5:
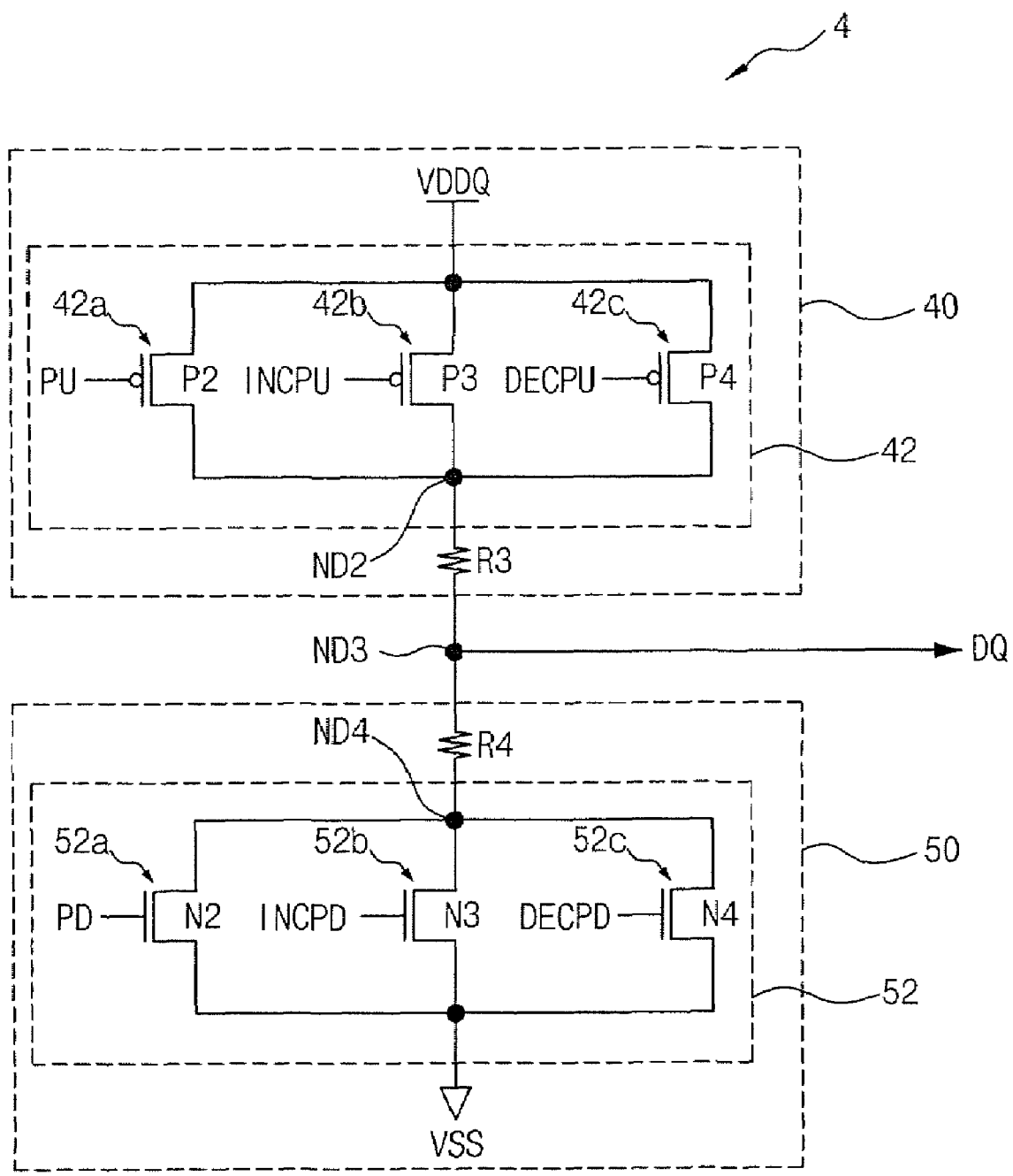
FIG. 5 is a detailed circuit diagram showing the on die termination resistor unit of FIG. 2.

Referring to FIG. 5, the ODT resistor unit 4 includes a pullup resistor unit 40 and a pulldown resistor unit 50.

The pullup resistor unit 40 includes a pullup switch unit 42 connected between a power supply voltage terminal VDDQ and a node ND2, and a resistor R3 connected between the node ND2 and an output node ND3.

More specifically, the pullup switch unit 42 includes a switch 42a controlled by the pullup driving signal PU, a switch 42c controlled by the pullup resistance increment signal INCPU, and a switch 42c controlled by the pullup resistance decrement signal DECPU.

These switches 42a, 42b and 42c are controllably turned-on by the pullup driving signal PU, the pullup resistance increment signal INCPU, and the pullup resistance decrement signal DECPU respectively. Each of the signals is applied to a gate of the respective switch 42a, 42b, or 42c. The switches include PMOS transistors P2, P3, and P4; and the POS transistors P2, P3, and P4 electrically connect the power supply voltage terminal VDDQ to the node ND2.

The pulldown resistor unit 50 includes a pulldown switch unit 52 connected between the ground voltage VSS and a node ND4, and a resistor R4 connected between the node ND4 and an output node ND3.

More specifically, the pulldown switch unit 52 includes a switch 52a controlled by the pulldown driving signal PD, a switch 52b controlled by the pulldown driving increment signal INCPD, and a switch 52c controlled by the pulldown resistance decrement signal DECPU.

These switches 52a, 52b, and 52c are controllably turned-on by the pulldown driving signal PD, the pulldown resistance increment signal INCPD, and the pulldown resistance decrement signal DECPD respectively. Each of these signals are applied to a gate of the respective switch. The switches 52a, 52b, and 52c are composed of NMOS transistors N2, N3, and N4, and the NMOS transistors electrically connect the ground voltage terminal VSS to the node ND4.

Referring to FIGS. 2 to 5 (described above), operations of the ODT device according to the embodiments of the present invention will now be explained.

In normal mode, the ODT device is controlled such that the pullup driving signal PU is enabled at a low level and pulldown driving signal PD is enabled at a high level. The pullup driving signal PU and the pulldown driving signal PD are from the ODT enable signal supplied by the EMRS. The test mode signal TODT, the resistance increment test signal TRTTINC, and the resistance decrement test signal TRTTDEC are all disabled at a low level.

As such, when the resistance control enable signal generating unit 10 (shown in FIG. 3) receives the disabled test mode signal TODT, the disabled resistance increment test signal TRTTINC, and the disabled resistance decrement test signal TRTTDEC, the resistance control enable signal generating unit 10 disables the resistance increment enable signal RTTINC and the resistance enable signal RTTDEC at a low level.

The resistance control signal generating unit 20 (shown in FIG. 4) combines the pullup/pulldown driving signal PU, PD with the disabled resistance increment enable signal RTTINC and the disabled resistance decrement enable signal RTTDEC. The resistance control signal generating unit then outputs the pullup/pulldown resistance increment signal INCPU, INCPD and the pullup/pulldown resistance decrement signal DECPU, DECPD.

At this time, the pullup/pulldown resistance increment signals INCPU and INCPD are outputted at a logic level same as that of the pullup/pulldown driving signals PU (low level), PD (high level), and the pullup/pulldown resistance decrement signals DECPU and DECPD are outputted at a logic level opposite to that of the pullup/pulldown driving signal PU, PD.

That is, in the normal mode, the pullup resistance increment signal INCPU is outputted at a low level, the pullup resistance decrement signal DECPU is outputted at a high level, the pulldown resistance increment signal INCPD is outputted at a high level, and the pulldown resistance decrement signal DECPD is outputted at a low level.

Subsequently, the switches 42a, 42b, which are controlled by the pullup driving signal PU and the pullup resistance increment signal INCPU, are turned on; and the switch 42c controlled by the pullup resistance decrement signal DECPU is turned off, whereby the pullup resistor unit 40 is set as an initial pullup resistance value.

Further, the switches 52a, 52b, which are controlled by the pulldown driving signal PD and the pulldown resistance increment signal INCPD respectively, are turned off; and the switch unit 52c controlled by the pulldown resistance decrement signal DECPD is turned off, whereby the pulldown resistor unit 50 is set as an initial pulldown resistance value.

In a test mode, the on die termination device is controlled such that the pullup driving signal PU is enabled at a low level and the pulldown driving signal PD is enabled at a high level (the pullup driving signal PU and pulldown driving signal PD are from the ODT enable signal outputted from the EMRS). The test mode signal TODT is enabled at a high level, and one of the resistance increment test signal TRTTINC and the resistance decrement test signal TRTTDEC is selectively enabled at a high level.

The case in which the resistance increment test signal TRTTINC is enabled at a high level will be considered first. The resistance control enable signal generating unit 10 (shown in FIG. 3) enables the resistance increment enable signal RTTINC at a high level, and disables the resistance decrement enable signal RTTDEC at a low level.

The resistance control signal generating unit 20 (shown in FIG. 4) outputs the pullup/pulldown resistance increment signal INCPU, INCPD at a logic level opposite to the pullup/pulldown driving signal PU (low level), PD (high level) due to the resistance increment enable signal RTTINC being at a high level. Subsequently, the switches 42b, 52b corresponding to the pullup/pulldown resistance increment signal INCPU, INCPD are turned off so that the pullup/pulldown resistance of the resistor unit 4 is increased. At this time, the pullup/pulldown driving signal PU, PD and the pullup/pulldown resistance decrement signal DECPU, DECPD keep the initial state, whereby operations of the switches 42a, 42c and 52a, 52c corresponding to these are the same as the initial state.

Considering the case in which the ODT device is in test mode and the resistance decrement test signal TRTTDEC is enabled at a high level, the resistance control enable signal generating unit 10 (shown in FIG. 2) enables the resistance decrement enable signal RTTDEC at a high level, and disables the resistance increment enable signal RTTINC at a low level.

The resistance control signal generating unit 20 (shown in FIG. 3) outputs the pullup/pulldown resistance decrement signal DECPU, DECPD at a logic level same as that of the pullup/pulldown driving signal PU (low level), PD (high level) due to the low level of the resistance decrement enable signal RTTDEC.

Subsequently, the switches 42c, 52c corresponding to the pullup/pulldown resistance decrement signal DECPU, DECPD are turned on so that the pullup/pulldown resistance of the resistor unit 4 is decreased. The pullup/pulldown driving signal PU, PD and the pullup/pulldown resistance increment signal INCPU, INCPD keep the initial state, whereby operations of the switch units 42a, 42b and 52a, 52b corresponding to these are same as in the initial state.

That is, in the ODT device according to the present invention, the switch units 42a, 42b, 42c and 52a, 52b, 52c constituting the pullup/pulldown resistor units 40, 50 are connected in parallel. Therefore, in the test mode, if the number of the switches connected in parallel by the pullup/pulldown resistance increment signal INCPU, INCPD is decreased, the terminal resistance RTT is increased, and if the number of switches connected in parallel by the pullup/pulldown resistance decrement signal DECPU, DECPD is increased, the terminal resistance RTT is decreased.

As such, the terminal resistance RTT can be easily controlled using the test signal. Therefore, it is possible to effectively perform a subsequent analysis even though the resistance value of the resistor R3, R4 is different from designed resistance value.

Figure 1:
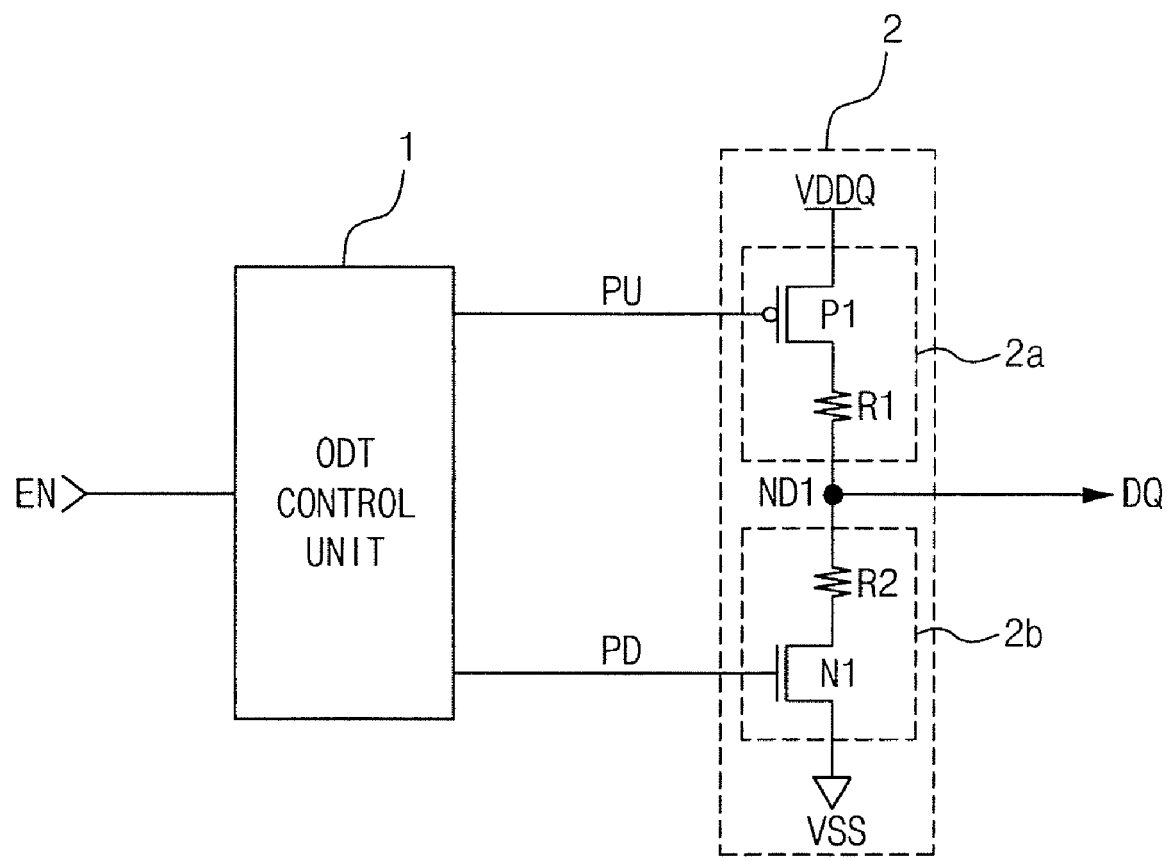
FIG. 1 is a structural diagram showing an on die termination device according to a related art.

Further, the prior art has a problem controlling the resistance values of R1 and R2 (shown in FIG. 1) due to a resistance change caused by a contact formed in a metal line. However, when the terminal resistance RTT is controlled as described above in the present invention, the problem does not exist. As such, in the present invention the accuracy of the terminal resistance RTT is enhanced upon applying the controlled terminal resistance value to a revision made to a metal layer, and, as a result, the accuracy of the impedance match between systems can be improved.

Although the above mentioned embodiments describe only one pullup resistance increment signal, one pulldown resistance increment signal, one pullup resistance decrement signal, and one pulldown resistance decrement signal; embodiments of the present invention may also include a plurality of the pullup/pulldown resistance increment signals and the pullup/pulldown resistance decrement signals, and correspondingly a plurality of the pullup/pulldown switches, whereby the terminal resistance RTT can be controlled more precisely.

As described above, it is possible to analyze the terminal resistance by providing the on die termination device that changes the terminal resistance value in accordance with the test signal of the present invention.

Further, there is an advantage of the present invention in that the accuracy of the terminal resistance is enhanced, and thus the revision accuracy of the on die termination device is improved by utilizing the set terminal resistance value in the revision after the analysis.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An on die termination device, comprising:
   an on die termination control unit which generates at least one resistance increment signal according to a resistance increment test signal and at least one resistance decrement signal according to a resistance decrement test signal; and
   an on die termination resistor unit which is driven by at least one driving signal, wherein a terminal resistance of the on die termination device is variable by the resistance increment signal and the resistance decrement signal.

2. The on die termination device as set forth in claim 1, wherein the on die termination control unit comprises:
   a resistance control enable signal generating unit which receives the resistance increment test signal that is selectively activated, the resistance decrement test signal that is selectively activated, and a test mode signal that is selectively activated;
   wherein the resistance control enable signal generating unit generates a resistance increment enable signal according to an activation of the resistance increment test signal and an activation of the test mode signal;
   wherein the resistance control enablement signal generating unit generates a resistance decrement enable signal according to an activation of the resistance decrement test signal and an activation of the test mode signal; and
   a resistance control signal generating unit which generates the resistance increment signals according to an activation of the resistance increment enable signal and the driving signal, and which generates the resistance decrement signals according to an activation of the resistance decrement enable signal and the driving signal.

3. The on die termination device as set forth in claim 2, wherein the test mode signal, the resistance increment test signal, and the resistance decrement test signal are applied from an extended mode register set.

4. The on die termination device as set forth in claim 2, wherein the resistance control enable signal generating unit comprises:
   a first NAND gate which NAND-combines the test mode signal with the resistance increment test signal;
   a first inverter which inverts an output signal of the first NAND gate and outputs the resistance increment enable signal;
   a second NAND gate which NAND-combines the test mode signal with the resistance decrement test signal; and
   a second inverter which inverts an output signal of the second NAND gate and outputs the resistance decrement enable signal.

5. The on die termination device as set forth in claim 2, wherein the resistance control signal generating unit comprises:
   a first output unit which inverts the driving signal to output the resistance increment signal when the resistance increment enable signal is activated; and
   a second output unit which outputs the driving signal as the resistance decrement signal when the resistance decrement enable signal is activated.

6. The on die termination device as set forth in claim 5, wherein the first output unit comprises:
   a first NOR gate which NOR-combines the resistance increment enable signal with the driving signal; and
   a third inverter which inverts an output signal of the first NOR gate and outputs the resistance increment signal.

7. The on die termination device as set forth in claim 5, wherein the second output unit comprises:
   a fourth inverter which inverts the driving signal; and
   a third NAND gate which NAND-combines the resistance decrement enable signal with an output signal of the fourth inverter and outputs the resistance decrement signal.

8. The on die termination device as set forth in claim 1, wherein the on die termination resistor unit comprises:
   a plurality of switch units, the switch units being connected in parallel between a power supply terminal and a first node and controlled by the driving signal, the resistance increment signal, and the resistance decrement signal to electrically connect the first node with the power supply terminal; and
   a resistor which is connected between the first node and an output node.

9. The on die termination device as set forth in claim 8, wherein the switch units are composed of PMOS transistors which are controlled by the driving signal, the resistance increment signal, and the resistance decrement signal which are applied to corresponding gates of the PMOS transistors to deliver the power supply voltage to the first node.

10. The on die termination device as set forth in claim 8, wherein the switch unit is composed of NMOS transistors which are controlled by the driving signal, the resistance increment signal, and the resistance decrement signal which are applied to each gate of the NMOS transistors to deliver the ground voltage to the first node.

11. An on die termination device comprising:
a resistance control enable signal generating unit which selectively activates and outputs a resistance increment enable signal and a resistance decrement enable signal in accordance with a resistance increment test signal and a resistance decrement test signal;
a resistance control signal generating unit which generates at least one or more pullup/pulldown resistance increment signals according to the resistance increment enable signal and outputs at feast one or more pullup/pulldown resistance decrement signals according to the resistance decrement enable signal; and
an on die termination resistor unit which is driven by a pullup driving signal and a pulldown driving signal and which controls an on die termination resistance value according to the pullup/pulldown resistance increment signal and the pullup/pulldown resistance decrement signal.

12. The on die termination device as set forth in claim 11, wherein the resistance control enable signal generating unit comprises:
a first NAND gate which NAND-combines a test mode signal with the resistance increment test signal;
a first inverter which inverts an output signal of the first NAND gate and outputs the resistance increment enable signal;
a second NAND gate which NAND-combines a test mode signal with the resistance decrement test signal; and
a second inverter which inverts an output signal of the second NAND gate and outputs the resistance decrement enable signal.

13. The on die termination device as set forth in claim 12, wherein the test mode signal, the resistance increment test signal and the resistance decrement test signal are supplied from an extended mode register set.

14. The on die termination device as set forth in claim 11, wherein the resistance control signal generating unit comprises:
a pullup resistance control signal generating unit which outputs the pullup driving signal as an pullup resistance increment signal and a pullup resistance decrement signal according to the resistance increment enable signal and the resistance decrement enable signal; and
a pulldown resistance control signal generating unit which outputs the pulldown driving signal as an pulldown resistance increment signal and a pulldown resistance decrement signal according to the resistance increment enable signal and the resistance decrement enable signal.

15. The on die termination device as set forth in claim 14 wherein the pullup resistance control signal generating unit comprises:
a first NOR gate which NOR-combines the pullup driving signal with the resistance increment enable signal;
a third inverter which inverts an output signal of the first NOR gate and outputs the pullup resistance increment signal;
a fourth inverter which inverts the pullup driving signal; and
a third NAND gate which NAND-combines an output signal of the fourth inverter with the resistance decrement enable signal and outputs the pullup resistance decrement signal.

16. The on die termination device as set forth in claim 14, wherein the pulldown resistance control signal generating unit comprises:
a fourth inverter which inverts the pulldown driving signal;
a second NOR gate which NOR-combines an output signal of the fourth inverter with the resistance increment enable signal and outputs the pulldown resistance increment signal;
a fourth NAND gate which NAND-combines the pulldown driving signal with the resistance decrement enable signal; and
a fifth inverter which inverts an output signal of the fourth NAND gate and outputs the pulldown resistance decrement signal.

17. The on die termination device as set forth in claim 11, wherein the on die termination resistor unit comprises:
a plurality of pullup switch units, the pullup switch units being connected in parallel between a power supply voltage terminal and a first node to be driven by the pullup driving signal, and the pullup switch units being controlled by the pullup resistance increment signal and the pullup resistance decrement signal to electrically connect the power supply voltage terminal with the first node
a first resistor which is connected between the first node and an output node;
a plurality of pulldown switch units, the pulldown switch units being connected in parallel between a ground voltage terminal and a second node to be driven by the pulldown driving signal, and the pulldown switch units being controlled by the pulldown resistance increment signal and the pulldown resistance decrement signal to connect the ground voltage terminal with the second node electrically; and
a second resistor which is connected between the second node and the output node.

18. The on die termination device as set forth in claim 17 wherein the pullup switch unit is composed of PMOS transistors which are controlled by the pullup driving signal, the pullup resistance increment signal, and the pullup resistance decrement signal which are applied to corresponding gates of the PMOS transistors to deliver the power supply voltage to the first node.

19. The on die termination device as set forth in claim 17, wherein the pulldown switch unit is composed of NMOS transistors which are controlled by the pulldown driving signal, the pulldown resistance increment signal, and the pulldown resistance decrement signal which are applied to corresponding gates of the NMOS transistors to deliver the ground voltage to the second node.

20. A on die termination device comprising:
a pullup resistor unit having a pullup resistance value increased according to a resistance increment test signal or decreased according to a resistance decrement test signal; and
a pulldown resistor unit which is connected with the pullup resistor unit through a common node and has a pulldown resistance value increased according to the resistance increment test signal or decreased according to the resistance decrement test signal.

21. The on die termination device as set forth in claim 20, wherein the resistance increment test signal and the resistance decrement test signal are output from an extended mode register, and the resistance increment test signal is set with a resistance increment signal that is activated and the resistance decrement test si nails set with a resistance decrement signal that is activated.

22. The on die termination device as set forth in claim 20, wherein the pullup resistor unit and the pulldown resistor unit each comprise three or more switch elements which are connected in parallel, wherein switch elements are controlled by the resistance increment signal to increase the pullup/pulldown resistance value and switch elements are controlled by the resistance decrement signal to decrease the pullup/pulldown resistance value.

23. The on die termination device as set forth in claim 22, wherein the pullup resistor unit and the pulldown resistor unit both comprise a resistor which is connected with the common node and the three or more switch elements.

24. The on die termination device as set forth in claim 22, wherein the switch elements of the pullup resistor unit are composed with PMOS transistors and the switch elements of the pulldown resistor unit are composted with NMOS transistors.

* * * * *